（12）United States Patent
Hollis et al.

(10) Patent No.: US 7,440,312 B2
(45) Date of Patent: Oct. 21, 2008

(54) MEMORY WRITE TIMING SYSTEM

(75) Inventors: Paul W. Hollis, Austin, TX (US);
George M. Lattimore, Austin, TX (US)

(73) Assignee: Analog Devices, Inc., Norwood, MA (US)

( * ) Notice: Subject to any disclaimer, the term of this patent is extended or adjusted under 35 U.S.C. 154(b) by 1 day.

(21) Appl. No.: 11/541,752

(22) Filed: Oct. 2, 2006

(65) Prior Publication Data

US 2008/0084780 A1    Apr. 10, 2008

(51) Int. Cl.
*G11C 11/00*    (2006.01)
*G11C 7/00*    (2006.01)

(52) U.S. Cl. .................. 365/154; 365/191; 365/195; 365/196; 365/203

(58) Field of Classification Search .................. 365/154, 365/191, 195, 196, 203
See application file for complete search history.

(56) References Cited

U.S. PATENT DOCUMENTS

| 5,511,031 | A | | 4/1996 | Grover et al. |
| 5,657,330 | A | * | 8/1997 | Matsumoto .................. 714/733 |
| 6,181,640 | B1 | * | 1/2001 | Kang ....................... 365/233.5 |
| 6,707,721 | B2 | * | 3/2004 | Singh et al. ............. 365/189.05 |
| 6,711,092 | B1 | | 3/2004 | Sabharwal .................... 365/233 |
| 2002/0186579 | A1 | * | 12/2002 | Yokozeki ..................... 365/154 |
| 2003/0026150 | A1 | * | 2/2003 | Rimondi ...................... 365/203 |
| 2007/0008771 | A1 | * | 1/2007 | Lee et al. .................... 365/154 |

* cited by examiner

*Primary Examiner*—Ly D Pham
(74) *Attorney, Agent, or Firm*—Iandiorio Teska & Coleman

(57) ABSTRACT

A memory write timing system includes a modified memory bitcell including a storage device and a write/read circuit for writing/reading data to/from the storage device; and an output circuit for detecting the current state of the storage device.

17 Claims, 5 Drawing Sheets

US 7,440,312 B2

MEMORY WRITE TIMING SYSTEM

FIELD OF THE INVENTION

This invention relates to an improved memory write timing system and more particularly to such a system which tracks standard memory bitcell operation time across process and environmental variables.

BACKGROUND OF THE INVENTION

Device performance in integrated circuits can be dramatically affected by extreme corners: extremes in temperature, operating voltage, and wafer processing. For certain combinations of these extreme corners, degraded device performance can cause difficulty writing the bitcells of memory arrays .e.g. SRAM's, DRAM's. For at least some of these extreme corners, bitcell writing can still be successfully achieved if sufficient time is allowed for that operation. However, building into control circuitry a longer amount of time to perform writes can also limit the performance of the memory at other corners.

In mobile applications, for example, the operating voltage may be decreased during periods of inactivity to save battery power. This low voltage combined with low temperature and the process variation of PFETs being much stronger than the NFETs, causes the bit cell write time to increase dramatically. For instance, in this type of scenario the timing column may slow down by a factor of five while the bitcells may slow down by a factor of ten, causing the write to fail. In one prior approach to the problem a fixed delay is introduced to provide a period of time for the write to be completed. Since bitcells don't respond to process variations in the same way as the timing chain or delay circuits at extreme corners, the introduced delay is not sufficient and the operation terminates before the write actually occurs. Another approach is to use the same delay produced by a read timing column (column of bitcells mimicking a standard bitcell column) for the read operation to time the write operation. There are two problems with this. First, since the read operation is normally longer than the write operation, time is wasted in the write operation. Second, in extreme corner conditions, the write can be slower than the read and the write operation is cut off before the write is complete.

BRIEF SUMMARY OF THE INVENTION

It is therefore an object of this invention to provide an improved memory write timing system for memory bit cells e.g. SRAM's DRAM's.

It is a further object of this invention to provide such an improved memory write timing system which closely tracks standard bitcell operation across process and environmental variables.

It is a further object of this invention to provide such an improved memory write timing system which will not complete the write cycle before a standard write would, yet will not long delay completion of the write cycle thereafter.

It is a further object of this invention to provide such an improved memory write timing system which properly times a write operation even in extreme corner conditions of low voltage, low temperature and skewed processing e.g. slow NFET and fast PFET operation.

It is a further object of this invention to provide such an improved memory write timing system which even in corner conditions tracks the more complex changes in timing operation of bitcells beyond the simpler scaling of delays that occur in most logic paths.

The invention results from the realization that an improved memory write timing system which closely tracks standard bitcell operation across process and environmental variables, can be achieved with a modified memory bitcell including a modified memory bitcell including a storage device and a write/read circuit for writing/reading data to/from the storage device; and an output circuit for detecting the current state of the storage device and more particularly in the case of an SRAM a modified memory bitcell including a pair of inverters in a latching configuration having first and second nodes with an access device connected to at least one node and an output circuit connected to one of the nodes for indicating the state of the modified bitcell and providing a write termination signal.

This invention features a memory write timing system including a modified memory bitcell having a pair of inverters in a latching configuration having first and second nodes and an access device connected to at least one of the nodes. There is an output circuit connected to one of the nodes for indicating the state of the bitcell and providing a write termination signal.

In a preferred embodiment the bitcell may include a pre-charge device for resetting the inverters to a known state in response to a word line reset signal. The access device may include an access switch connected to one of the nodes and actuated by the reset signal. There may be a dummy write driver responsive to a write enable signal to provide a dummy data bit over a dummy bitline through the access device to the pair of latching inverters in the bit cell. There may be a reset circuit responsive to the reset signal to disable the write driver from providing the dummy data bit. The dummy write driver may include a programmable switching circuit for controlling the time of enabling the write driver to provide the dummy data bit. The output circuit may include an output inverter. There may be a second output inverter connected to the other node. The dummy bitline may include a timing column delay emulator for simulating the delay of a standard timing column. The access device may include a second access switch and a replica timing column delay emulator connected to the second access switch. The access device may include an access switch connected to each node and further may include first and second driver inverters connected to the first and second nodes respectively. The modified memory bitcell may be an SRAM bitcell.

The invention also features a memory write timing system including a modified memory bitcell having a pair of back to back inverters in a latching configuration having first and second nodes and a first access switch connected to a first node and a second access switch connected to a second node. There is a dummy write driver responsive to an enable signal to provide a dummy data bit over a dummy bitline through the access device to the pair of latching inverters. An output circuit is connected to one of the nodes for indicating the state of the bitcell and providing a write termination signal.

In a preferred embodiment the bitcell may further include a pre-charge device for resetting the inverters to a known state in response to a word line reset signal. There may be a reset circuit responsive to the reset signal for disabling the write driver from providing the dummy data bit. The dummy write driver may include a programmable switching circuit for controlling the timing of enabling of the write driver to provide the dummy data bit. The output circuit may include an output inverter. The modified memory bitcell may be an SRAM bitcell.

More broadly the invention features a memory write timing system including a modified memory bitcell including a storage device and a write/read circuit for writing/reading data to/from the storage device and an output circuit for detecting the current state of the storage device.

In a preferred embodiment the output circuit may further provide a write termination signal. The storage device may include a pair of inverters in a latching configuration having first and second nodes. The read/write circuit may include an access device connected to at least one of the nodes.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
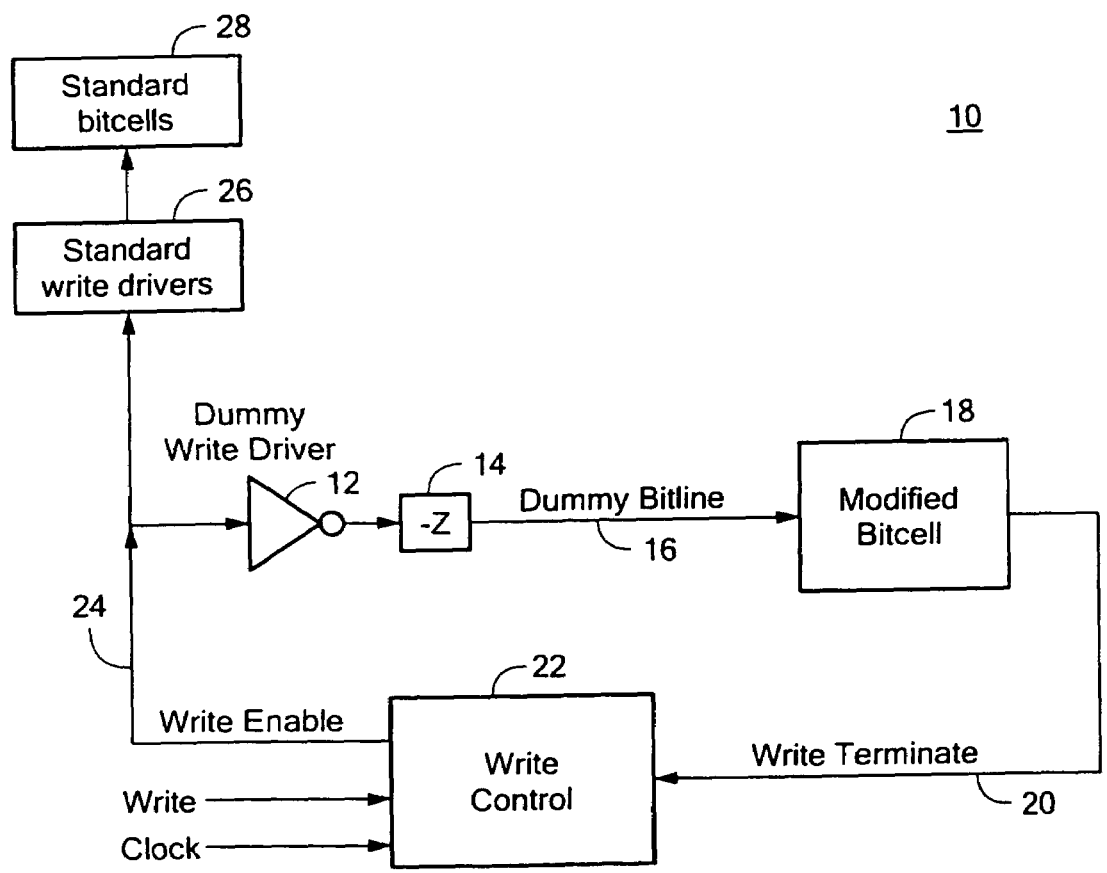
FIG. 1 is a simplified schematic block diagram of one embodiment of a memory write timing system according to his invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1 a memory write timing system 10, according to this invention, which includes a dummy write driver 12, a delay 14 representing a delay introduced by a normal bit line, and a dummy bit line 16 which connects dummy write driver through delay 14 to a modified bitcell 18. Bitcell 18 is modified because in addition to a storage device there is at least an output circuit connected to a node of the bitcell for indicating a state of the bitcell and providing a write termination signal on line 20 to write control 22.

In operation upon receiving a write command and a subsequent clock signal, write control 22 generates a write enable signal 24 which is delivered to all standard write drivers 26 for operating bitcells 28. That same write enable signal is delivered to dummy write driver 12 which, after the delay -Z introduced by delay circuit 14, delivers, on dummy bitline 16, a dummy databit to modify bitcell 18. After a time determined by the delay -Z 14 and the time it takes for the databit to change the state of modified bitcell 18, the state change is reflected in a Write Terminate signal to write control 22 to turn off the write enable signal.

When the dummy write driver 12 is activated by the write enable signal 24, it causes dummy bitline 16 to fall after a delay -Z to match it to the signal present in the actual bitline write drivers. Modified bitcell 18 will change state at a time similar to the standard bitcells and its output signal, Write Terminate, indicates that change of state. Modified bitcell 18 is designed so that it changes state slightly more slowly than the standard bitcell implying that the standard bitcell will have been successfully written to at least by the time Write Terminate goes active. The Write Terminate signal then causes write control block 22 to terminate the write operation and cancel the write enable signal. Modified bitcell 18 changes states slightly more slowly than a standard bitcell because among other things it has connected to one of its load-sensitive nodes an output circuit for indicating the state of the bitcell and providing the Write Termination signal 20. Modified bitcell 18 is constructed of the same devices with topology similar to the standard bitcells. For example it is a bitcell derived from the memory array of standard bitcells located sufficiently within the array so that edge effects are avoided and the poly density is similar to the rest of the array. Thus its characteristics will track those of a standard bitcell across process, voltage and temperature thereby guaranteeing sufficient time to write to bitcells regardless of the operating conditions.

Figure 2:
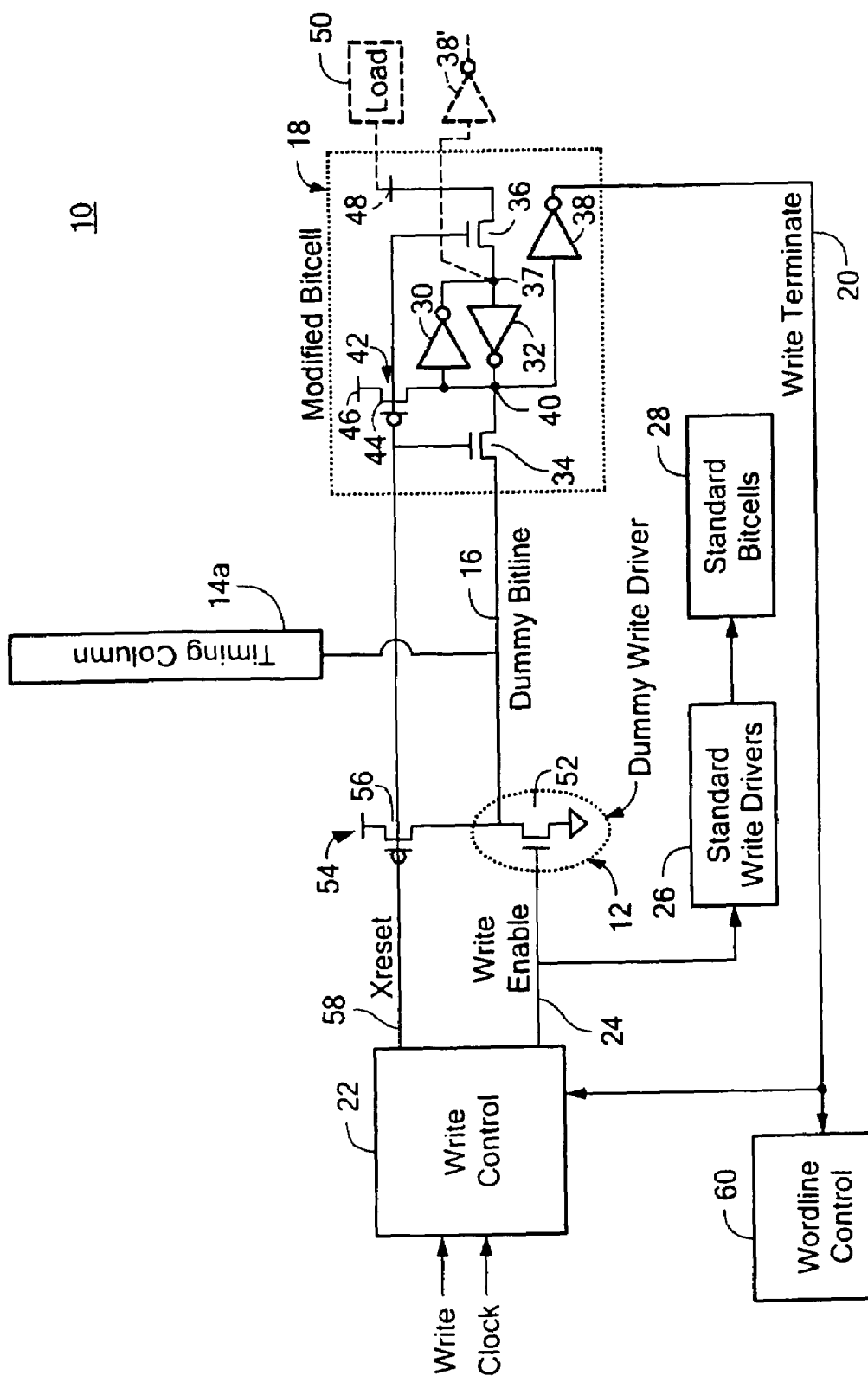
FIG. 2 is a more detailed diagram of the system of FIG. 1.

System 10 is shown in more detail in FIG. 2, where the devices in this embodiment are all implemented with CMOS FET's: either N channel, NFETs, which turn on with high voltage or P channel, PFETs, which turn on with low voltage. Modified bitcell 18 can be recognized as containing a standard six transistor static RAM cell for an SRAM which includes, as a storage device, back to back connected inverters 30, 32 connected in a latching configuration along with NFET access switches 34 and 36 connected to node 37 of inverter pair 30, 32. The modifications to this standard bitcell in modified bitcell 18 includes at least the fact that there is an output circuit inverter 38 connected to node 40 which changes the loading on modified bitcell 18 compared to a standard bitcell. It is this connection to node 40 that monitors the state of bitcell 18 and provides the Write Terminate signal 20. The bit cell may be further modified by the presence of pre-charge circuit 42 which includes PFET transistor 44. In the initial state when there is no write enable signal, node 40 is high and node 37 is low; when the write is off pre-charge circuit 42 pulls node 40 high and causing node 37 to go low. Terminal 46 and terminal 48 may be connected to the power supply or terminal 48 may be connected to a load 50 similar to that on a standard bitline to make it track even more closely the operation of a standard bitcell. The example used refers to SRAM implementation but DRAM or other types can be benefited by this invention as well.

To further improve performance an inverter 38' may be connected to node 37 to balance the presence of inverter 38 and it need not have its output connected further. Dummy write driver 12 driven by write enable 24, may incorporate a NFET 52. Write control 22 may generate Xreset 58 which functions similarly to a wordline for the modified bitcell 18, and may also enable reset circuit 54 implemented by PFET 56 to pre-charge the dummy bitline 16. Delay 14 is effectively implemented by the timing column delay for a typical standard timing column 14a for the memory bitcell array. Timing column 14a may simply be a replica of a column of bitcells attached to bitlines which will emulate the delay of a standard column of bitcells. Thus, the delay from the time dummy write driver 12 starts to bring down dummy bitline 16 to activate modified bitcell 18, would be, essentially, the time it takes for the write enable signal to begin changing the state of a standard bitline with the standard write drivers 26. Dummy bitline 16 is therefore essentially identical to any other single bitline, since it is running through timing column 14a of modified bitcells and is connected to the equivalent of the access switch 34 for every bitcell in the column. The timing column bitcells are modified in a different manner; with ½ the cell remaining active for the read timing mechanism, and the write timing utilizing the other disconnected access device, equivalent to NFET 36, strictly as a load. Thus, the portion used for write timing essentially is already available. Activation of dummy write driver 12 causes dummy bitline 16 to fall at a rate determined by the strength of the driver and the loading of timing column 14a. After causing the dummy bitline 16 and modified bitcell 18 to return to their initial states Xreset 58 (active low) is de-asserted by write control 22 which enables the access switches 34, 36 of modified bitcell 18. Subsequently, write enable 24 asserts causing dummy bitline 16 to fall and, after an amount of time related to the process variables mentioned above, bitcell 18 flips states which causes output circuit, inverter 38, to assert the Write Terminate 20. When write control 22 detects this situation it de-asserts write enable 24 and asserts Xreset returning all circuitry to the initial condition situation. At the same time the standard word line control 60 has been maintaining assertion of the selected word line to keep a row of standard bitcells in the array active until Write Terminate 20 indicates that a successful write should have occurred.

Figure 3:
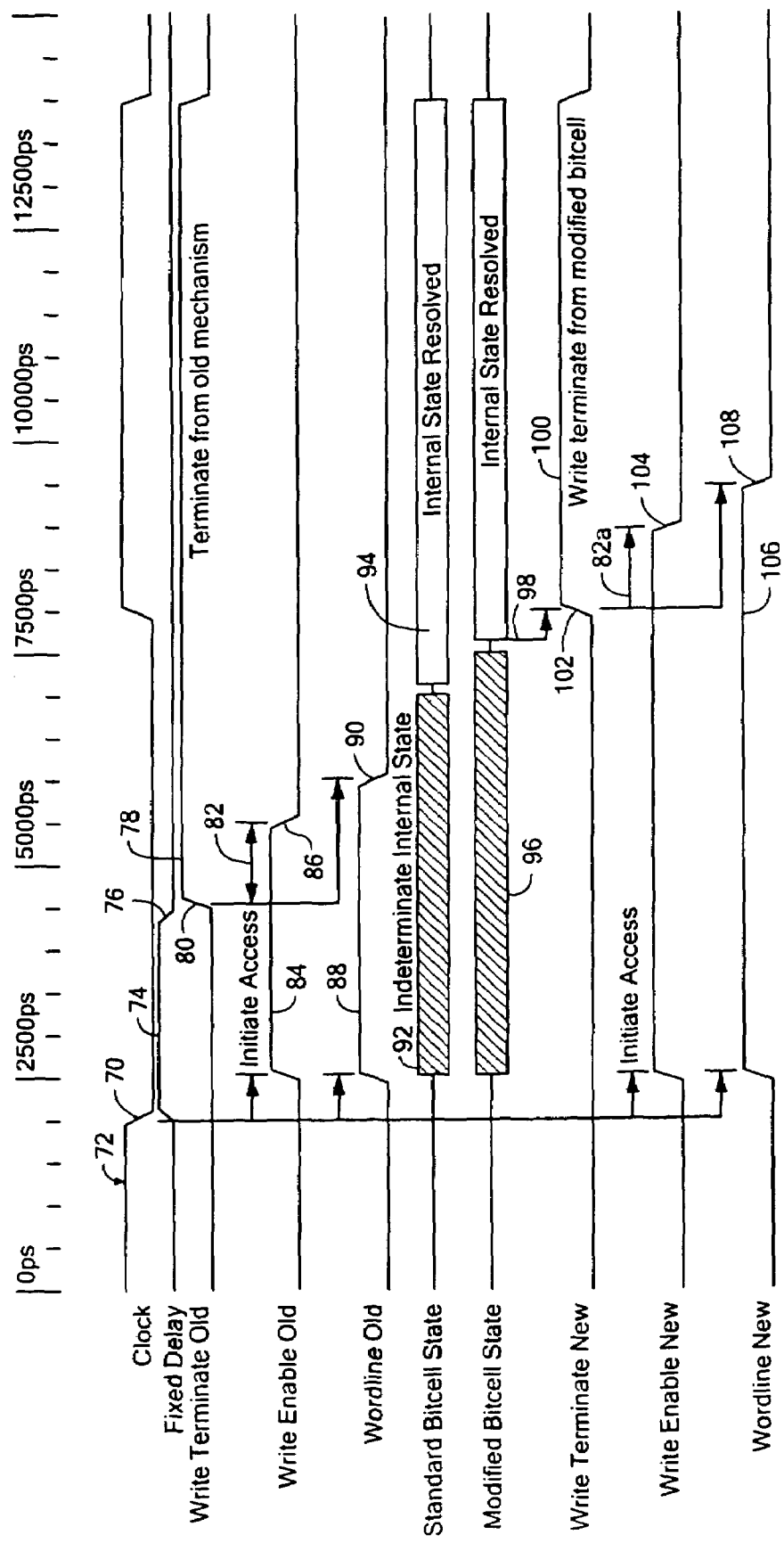
FIG. 3 is a timing diagram comparing signals occurring in prior art systems with those in the system of this invention.

An important feature of this invention is that the characteristics of modified bitcell 18 track those of a standard bitcell in the memory array across process variables temperature and voltage and the fact that the write cycle will not complete until the modified bitcell has changed state to develop the Write Terminate 20 signal. This makes the invention effective even in extreme corner situations where at low voltage and low temperature and skewed processing (that is, the NFETS running slowly and the PFETS' running more quickly) the write timing is sufficient to complete the write operation before issuing the Write Terminate 20 signal, and yet does not leave such a margin that time is wasted at other corners of operation. A comparison of the prior art fixed delay approaches to the problem and the success of this invention is depicted using waveforms in FIG. 3 labeled old for the prior art operation and new for this invention operation. There it can be seen that upon the falling edge 70 of clock signal 72 a fixed delay 74 is initiated. At the end of the fixed delay 76 the write terminate signal 78 is begun at transition 80. After a period of time determined by gate and other circuitry delays indicated at 82 the write enable signal 84 turns off at 86 as does word line 88 at transition 90. However, it can be seen that the standard bitcell condition 92 is that of indeterminate internal state so the write signal has ended before a write can be affected in a standard bitcell which doesn't resolve its internal state 94 until some time later. In contrast in this invention there is no fixed delay, rather after the modified bitcell state 96 resolves itself as at 98, then the Write Terminate 100 begins as at 102, which, after a delay 82a caused by gate and other circuit delays, causes the write enable new signal to transition at 104 to the off state after which the word line 106 also transitions at 108 to the off state.

With this invention then the modified bitcell 18 remains in the indeterminate state as least as long as the standard bitcell. When it does resolve its state, the modified bitcell changes state directly and triggers the Write Terminate, which in turn causes write enable and word line to de-assert. This terminates the write and ultimately the access cycle but not before the successful write of the standard bitcells. The cycle time for the entire chip must be long enough to allow the circuit to complete its function and reset. This is reasonable since anytime a chip is operating in extreme process corners it is expected that the clock period will have to be adjusted since devices in all circuitry are somewhat affected.

Figure 4:
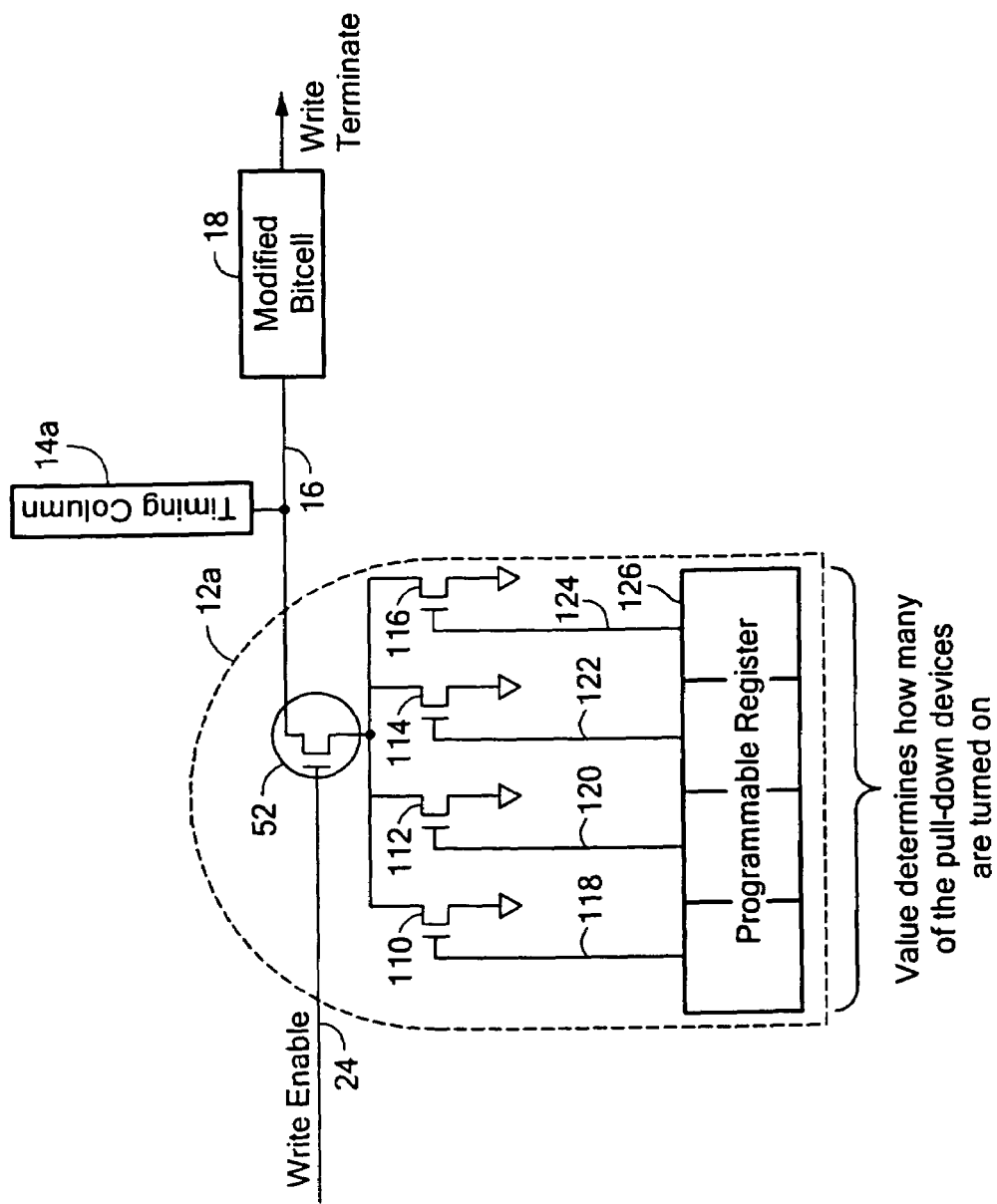
FIG. 4 is a more detailed schematic diagram of the dummy write driver of FIG. 2.

Although thus far dummy write driver 12 is depicted as implemented with a single switching device NFET 52, FIG. 2, this is not a necessary limitation of the invention. For example, as shown in FIG. 4, dummy write driver 12a may include one or more other switches, NFETs 110, 112, 114, 116. When all of transistors 110-116 are on and write enable 24 turns on device 52, dummy bitline 16 will be drawn down the quickest, whereas when only one of the programmable transistors, for example 110, is on and 112, 114, 116 are not, dummy bitline 16 will be brought down the slowest. For faster timing column discharge all devices all will be on, for slower discharge one or more may be on. With their control lines 118, 120, 122, 124 controlled by programmable register 126 the desired one of the sixteen possible states can be programmed easily by placing the proper bits in register 126.

Figure 5:
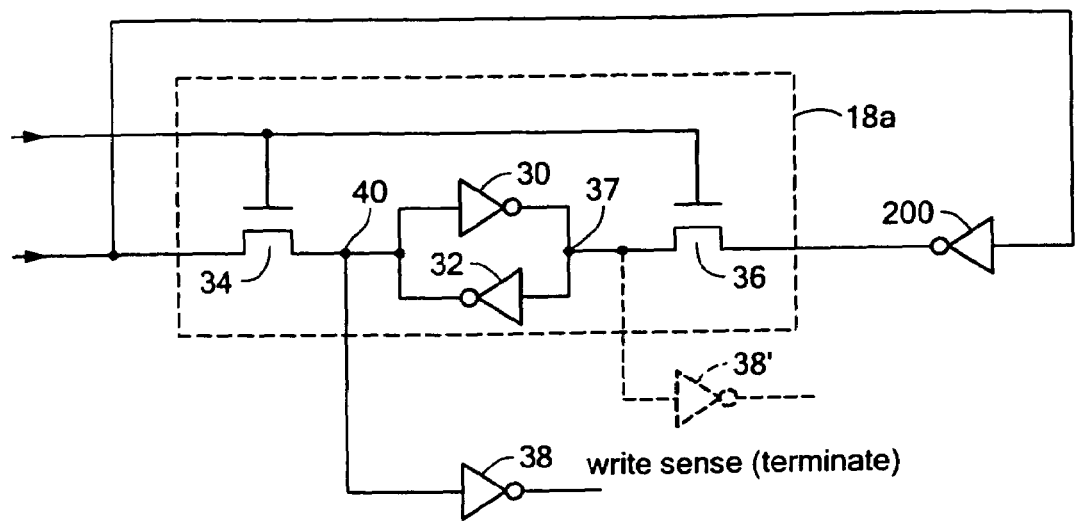
FIGS. 5, 6, 7 show alternative embodiments which all provide an output connecting to a node of the modified bitcell to sense the state of the modified bitcell.
Figure 6:
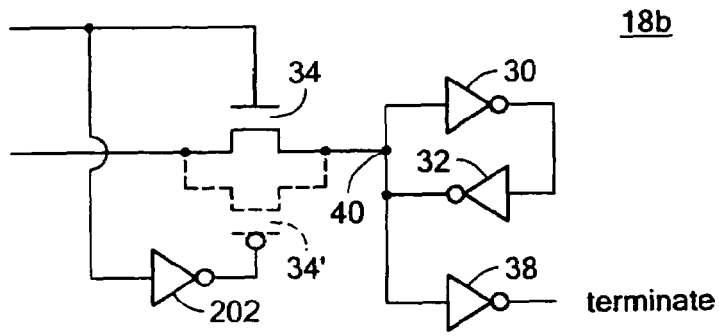
Figure 7:
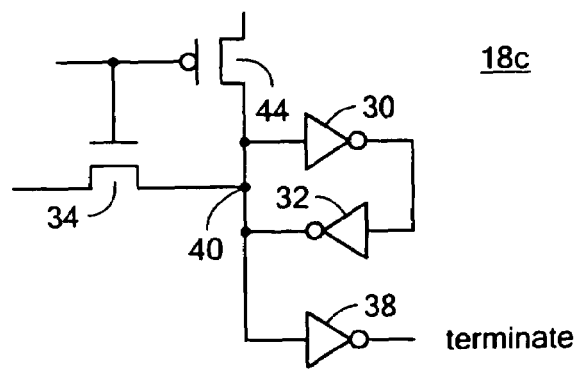

FIGS. 5-7 illustrate other embodiments of the invention. In FIG. 5 modified bitcell 18a has no reset input but uses inverter 200 to alternately write to inverters 30, 32. In this case external circuitry must be aware of the previous state, and detect when the cell switches to its new state.

In FIG. 6, in a configuration adaptable for use in a register file, P channel switch 34' served by inverter 200 is paralleled with N channel switch 34 so that node 40 can be forced high or low for a write operation.

In FIG. 7 access switch 36 has been eliminated without effecting the fundamental application of this invention.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A memory write timing system comprising:
   a modified memory bitcell including a pair of inverters in a latching configuration having first and second nodes, an access device connected to at least one of said nodes, and a pre-charge device for resetting the inverters to a known state in response to a word line reset signal; and
   an output circuit connected to one of said nodes for indicating the state of said bitcell and providing a write termination signal.

2. The memory write timing system of claim 1 in which said one access device includes an access switch connected to one of said nodes and actuated by said reset signal.

3. The memory write timing system of claim 2 further including a dummy write driver responsive to a write enable signal to provide a dummy data bit over a dummy bitline through said access device to said pair of latching inverters in said bitcell.

4. The memory write timing system of claim 3 further including a reset circuit responsive to said reset signal for disabling said write driver from providing said dummy data bit.

5. The memory write timing system of claim 4 in which said dummy write drive includes a programmable switching circuit for controlling the time of enabling of said write driver to provide said dummy data bit.

6. The memory write timing system of claim 1 in which said output circuit includes an output inverter.

7. The memory write timing system of claim 6 in which there is a second output inverter connected to the other said node.

8. The memory write timing system of claim 3 in which said dummy bit line includes a timing column delay emulator for simulating the delay of a standard timing column.

9. The memory write timing system of claim 8 in which said access device includes a second access switch and a replica timing column delay emulator connected to said second access switch.

10. The memory write timing system of claim 1 in which said access device includes an access switch connected to each said node, and further including first and second driver inverters connected to said first and second nodes, respectively.

11. The memory write timing system of claim 1 in which said modified memory bitcell is an SRAM bitcell.

12. A memory write timing system comprising:
a modified memory bitcell including a pair of back to back inverters in a latching configuration having first and second nodes, and a pre-charge device for resetting said inverters to a known state in response to a word line reset signal;
a first access switch connected to the first node and a second access switch connected to the second node;
a dummy write driver responsive to a write enable signal to provide a dummy data bit over a dummy bit line through said access device to said pair of latching inverters; and
an output circuit connected to one of said nodes for indicating the state of said bitcell and providing a write termination signal.

13. The memory write timing system of claim 12 further including a reset circuit responsive to said reset signal for disabling said write driver from providing said dummy data bit.

14. The memory write timing system of claim 12 in which said dummy write drive includes a programmable switching circuit for controlling the time of enabling of said write driver to provide said dummy data bit.

15. The memory write timing system of claim 12 in which said output circuit includes an output inverter.

16. The memory write timing system of claim 12 in which said modified memory bitcell is an SRAM bitcell.

17. A memory write timing system comprising:
a modified memory bitcell including a pair of inverters in a latching configuration having first and second nodes and an access device connected to at least one of said nodes, the access device including an access switch connected to each said node, and further including first and second driver inverters connected to said first and second nodes, respectively; and
an output circuit connected to one of said nodes for indicating the state of said bitcell and providing a write termination signal.

* * * * *